United States Patent
Huang

(10) Patent No.: US 6,171,940 B1
(45) Date of Patent: Jan. 9, 2001

(54) METHOD FOR FABRICATING SEMICONDUCTOR DEVICES HAVING SMALL DIMENSION GATE STRUCTURES

(75) Inventor: Jui-Tsen Huang, Taipei (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/410,691

(22) Filed: Oct. 1, 1999

(51) Int. Cl.$^7$ ................................................ H04L 21/3205
(52) U.S. Cl. .......................... 438/585; 438/197; 438/671; 438/952
(58) Field of Search ..................... 438/197, 671, 438/585, 952, 303, 304

(56) References Cited

U.S. PATENT DOCUMENTS

| | | | | |
|---|---|---|---|---|
| 4,818,715 | * | 4/1989 | Chao | ..................... 438/304 |
| 5,656,523 | * | 8/1997 | Wilhoit | ................. 438/303 |
| 5,753,557 | * | 5/1998 | Tseng | ..................... 438/303 |

* cited by examiner

Primary Examiner—Trung Dang
(74) Attorney, Agent, or Firm—Harness, Dickey & Pierce, P.L.C.

(57) ABSTRACT

A method for forming semiconductor devices having small dimension gate structures is disclosed. The present invention includes a photoresist shrink process and an organic material layer having low dielectric constant in between the polysilicon layer and the anti-reflection layer. The steps of the method of the present invention include: First of all, providing a semiconductor device having a silicon substrate therein; then, forming a gate oxide layer and a polysilicon layer over the silicon substrate one after another; next, depositing an organic material layer having low dielectric constant over the polysilicon layer; subsequently, forming an anti-reflection layer over the organic material layer; forming a photoresist layer over the anti-reflection layer; followed by, etching the anti-reflection layer and carrying out a photoresist shrink process; etching the organic material layer; etching the polysilicon layer; and finally, removing the photoresist layer, the anti-reflection layer, and the organic material layer that is on top of the polysilicon layer.

15 Claims, 4 Drawing Sheets

METHOD FOR FABRICATING SEMICONDUCTOR DEVICES HAVING SMALL DIMENSION GATE STRUCTURES

BACKGROUND OF THE INVENTION

1. Field of the Invention

The present invention generally relates to a method for fabricating semiconductor devices, and more particularly, relates to a photoresist shrink process and an organic material layer having low dielectric constant. The present invention is capable of making gate structures having small dimensions, and in providing semiconductor devices with low production cost.

2. Description of the Prior Art

Recently, demand for semiconductor devices has rapidly increased owing to widespread use of the integrated electronic circuit. In particular, as more than hundreds or thousands of electrical components are integrated into the ICs, means for scaling down the dimension of the MOSFET and for reducing fabrication costs has become imperative.

In logic product applications, the smaller the gate structure the faster the handling speed and the higher the integrity of semiconductor devices. Therefore, the production of gate structures having small dimension will be the most important trend in the present day. For the conventional semiconductor devices, when the optical resolution is required to achieve gate structures with small dimension, the size of gate electrodes need to be smaller and smaller, also the thinner the more exposed, and the photoresist layer needs to be thin comparatively. This thin photoresist layer might not be thick enough for blocking the etching process in the follow-up fabrication, hence, is not able to be used in the etching process.

Consequently, semiconductor devices with small dimensions and low production cost are desired urgently.

SUMMARY OF THE INVENTION

In accordance with the present invention, using fluorocarbon/oxygen/helium (C2F6/O2/He) gas mixture for forming a shrunken photoresist layer carries out a photoresist shrink process. Moreover, the present invention can solve this thin photoresist layer which might not be thick enough for blocking the etching process in the follow-up fabrication. A method is provided for forming semiconductor devices with a photoresist shrink process and that substantially produces semiconductor devices with small dimension and at low production cost.

Another object of the present invention is to provide a semiconductor device 6, wherein the organic material layer having low dielectric constant on top of the polysilicon layer is used for a the purpose analogous to a hard mask. Moreover, this organic material layer is also very easy to be removed by using a dry etching method.

A further object of the present invention is to provide a semiconductor device which uses the photoresist shrink process to decide the size of the gate electrode. The present invention can fabricate gate structures having small dimensions, and hence provide a highly integrated semiconductor device.

In accordance with the above objects, a method for fabricating gate structures having small dimension comprises the following steps: Firstly, providing a semiconductor device having a semiconductor substrate therein, then forming a gate oxide layer and a polysilicon layer over the semiconductor substrate one after another Next, depositing a dielectric layer over the polysilicon layer, forming an anti-reflection layer over the dielectric layer, and forming a photoresist layer over the anti-reflection layer for defining the location of a gate electrode. Consequentially, using the photoresist layer as a mask for etching the anti-reflection layer and carrying out a photoresist shrink process, where the dielectric layer is also etched partially, thereafter using the photoresist layer as a mask for etching the dielectric layer, accompanying that, the photoresist layer is also etched partially. After these steps, using the photoresist layer as a mask for etching the polysilicon layer till a surface of said gate oxide layer is exposed, accompanying that, the photoresist layer and the anti-reflection layer are removed within the above etching process, and finally, removing the dielectric layer that is on top of said polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 1–6, the process flow of a preferred embodiment according to the present invention is depicted in cross-sectional views. These drawings show several key steps in sequential processes.

Figure 1:
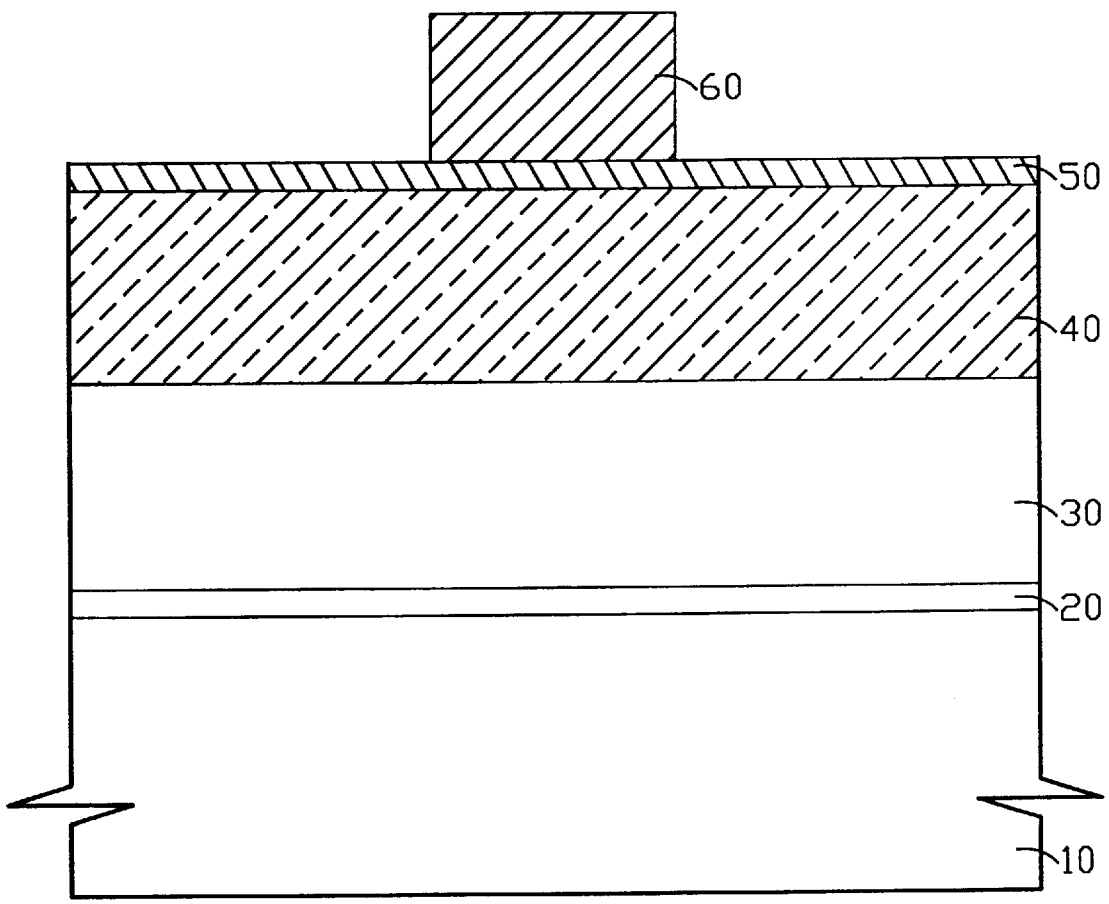
FIG. 1 is a cross-sectional view of a semiconductor device having at least a gate oxide layer, a polysilicon layer, organic material with low dielectric constant, an anti-reflection layer and a photoresist layer in an embodiment of the present invention.

The wafer is sent into a furnace tube, where the silicon on the top surface of the wafer is oxidized by using dry oxidation to form silicon dioxide having a thickness in between about 20 angstroms and about 30 angstroms as shown in FIG. 1. This silicon dioxide layer will be used as a gate oxide layer 20 for semiconductor devices. Followed up closely, a polysilicon layer 30 is deposited by using low-pressure chemical vapor deposition to a thickness between about 2000 angstroms to about 3000 angstroms over the gate oxide layer 20. Thermal diffusion or ion implantation is carried out to dope highly concentrated phosphorus or arsenic ions into the polysilicon layer for reducing the resistivity of the gate electrode. Moreover, an organic material layer 40 with low dielectric constant has a thickness in between about 3000 angstroms to about 4000 angstroms over the polysilicon layer 30. Next, an anti-reflection layer 50 comprising inorganic material, preferably silicon oxynitride (SiON), is formed over the organic material layer 40. Because the dimension of gate electrodes is becoming smaller and smaller in the present day, therefore, the anti-reflection layer 50 is definitely needed for preventing the reflection from the lower layer. After this, a photoresist layer 60 is coated over the anti-reflection layer 50. An I-line stepper is used to perform a partial exposure for transferring the pattern on the mask onto the photoresist fully, then the development of the photoresist is carried out to define the location of the gate electrode.

Figure 2:
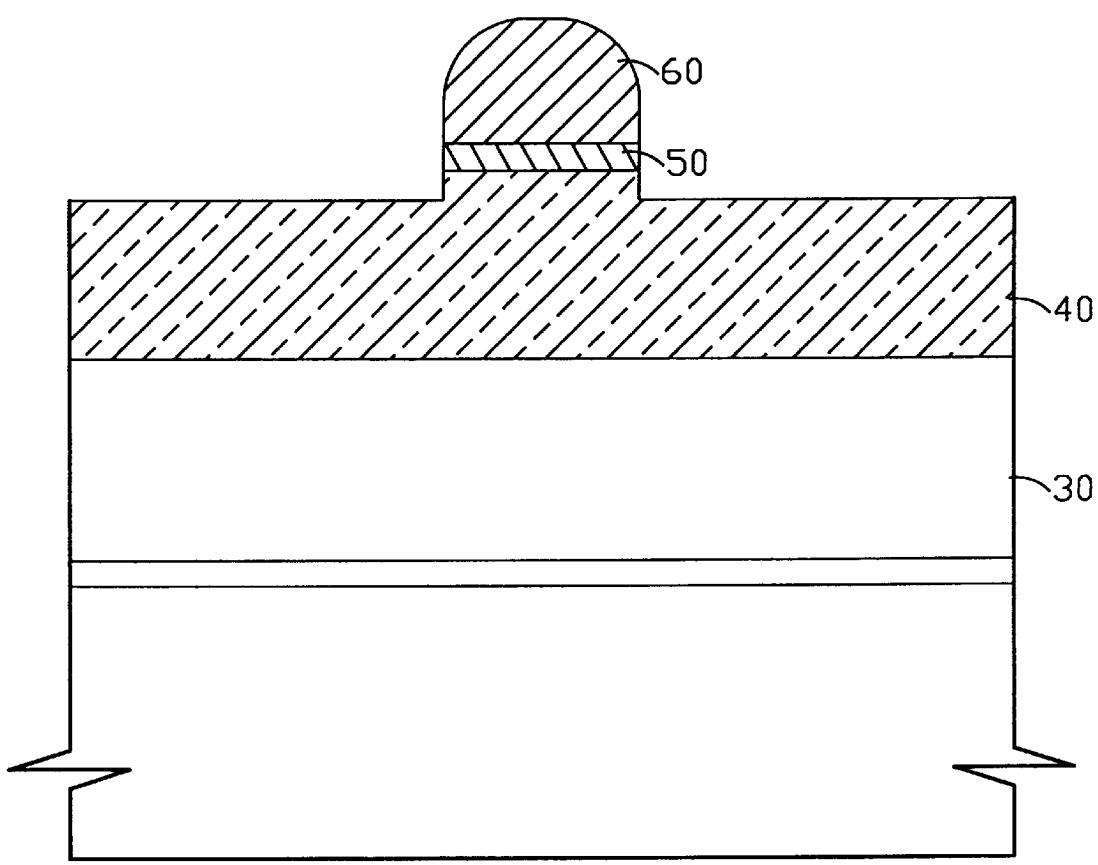
FIG. 2 is a cross-sectional view of a semiconductor device having at least a shrunken photoresist layer and etched anti-reflection layer in an embodiment of the present invention.

In accordance with FIG. 2, using fluorocarbon/oxygen/helium (C2F6/O2/He) gas mixture for forming a shrunken photoresist layer 60 carries out a photoresist shrink process. Although the photoresist layer 60 shrinks much, the thickness of the photoresist layer 60 would not be affected much to face follow-up fabrication. The shrunken photoresist layer 60 is used as a mask for etching the anti-reflection layer 50 by using dry etching method, and in the meanwhile, the organic material layer 40 is also etched partially.

Figure 3:
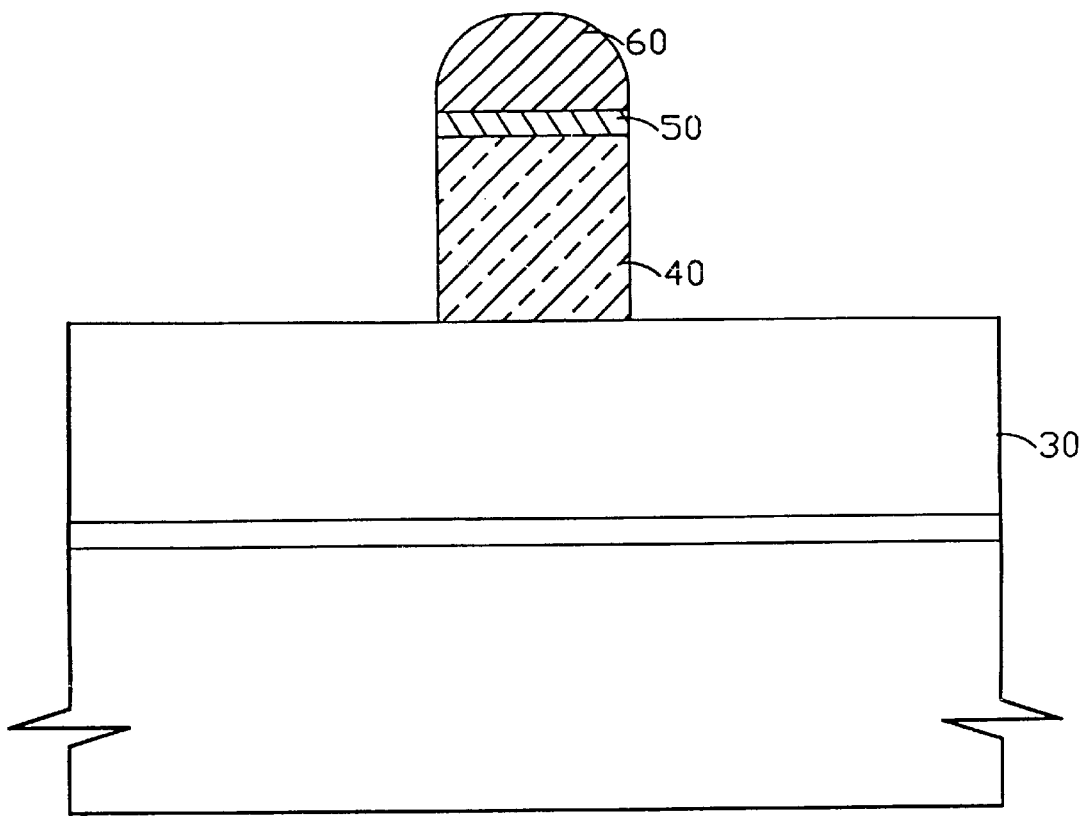
FIG. 3 is a cross-sectional view of a semiconductor device having at least etched organic material layer with low dielectric constant in an embodiment of the present invention.

Now referring to FIG. 3, the organic material layer 40 with low dielectric constant is etched by using an anisotropic etching method, where it is used for a purpose analogous to a hard mask. However, hard masks are normally made up of the material like silicon nitride or oxide, which are not easy to etch away, hence, an acidic trough is required to remove the conventional hard masks. Conversely, the organic material layer 40 with low dielectric constant is easy to be etched. Accompanying a removal of the organic material layer 40, the shrunken photoresist layer 60 is also etched partially.

Figure 4:
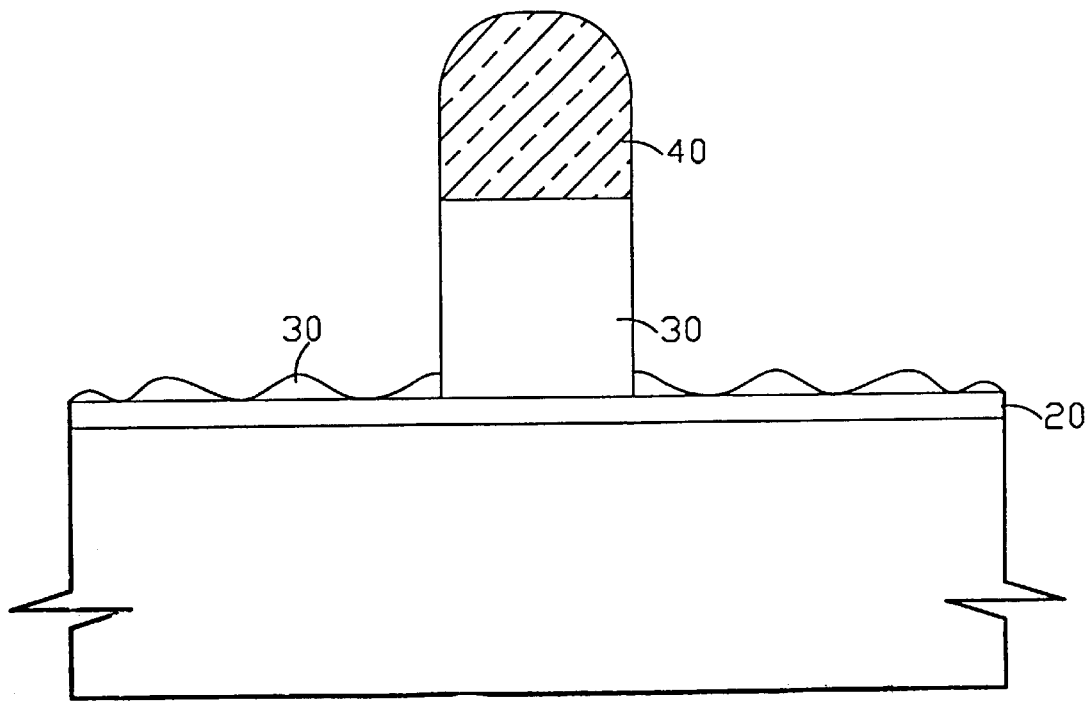
FIG. 4 and FIG. 5 depict the process flow of an embodiment according to the present invention in cross-sectional views, wherein an etched polysilicon layer is comprised.

In FIG. 4, by means of the shrunken photoresist layer 60 and the anti-reflection layer 50 to act as a mask for defining the size of the gate electrode. Then, the polysilicon layer 30 is etched by using an anisotropic etching method to form a gate structure. Nevertheless, this etching procedure will not etch away the entire polysilicon layer not covered by the mask, leaving the remaining portion of the polysilicon layer on top of the gate oxide layer 20. Accompanying the etching of the polysilicon layer, the shrunken photoresist layer 60 and the anti-reflection layer 50 are removed.

Figure 5:
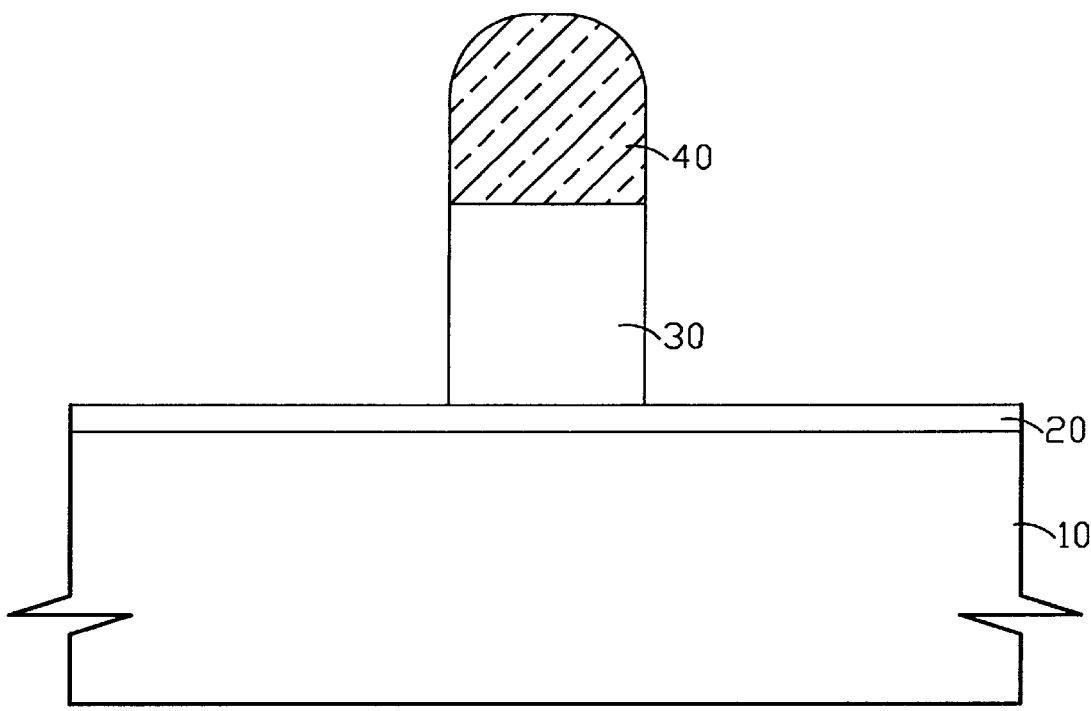

Next, in FIG. 5, the anisotropic etching method is used again to etch the remaining portion of the polysilicon layer 30 till a surface of the gate oxide layer is exposed.

Figure 6:
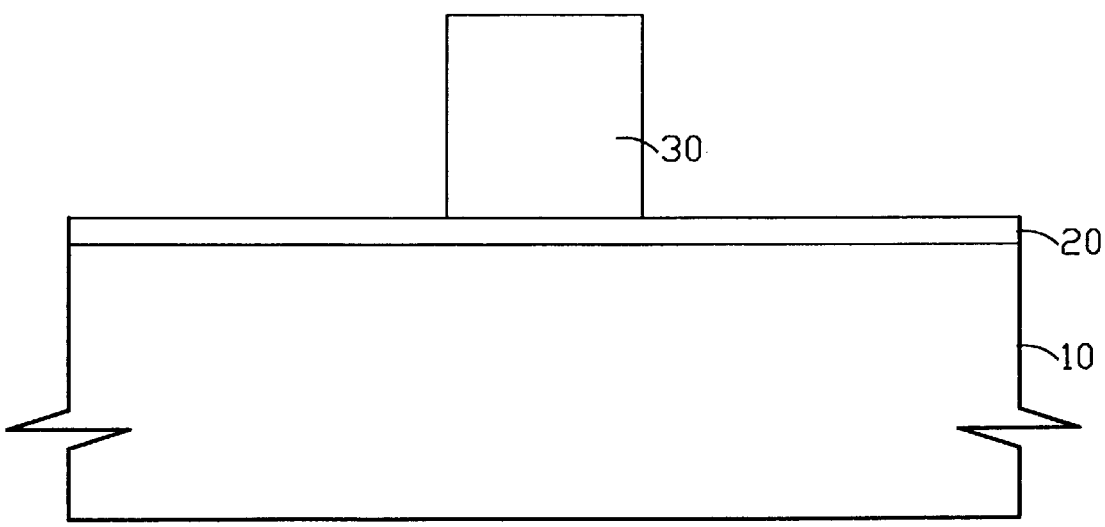
FIG. 6 is a cross-sectional view of a semiconductor device having at least removed organic material layer with low dielectric constant in an embodiment of the present invention.

Finally, in FIG. 6, the organic material layer that is on top of the polysilicon layer 30 is etched by using anisotropic etching method. Since it is made of organic material having low dielectric constant, hence, it can be removed by using plasma bombardment and will not end up with the phenomena of cutting angles in the polysilicon layer.

Although specific embodiments have been illustrated and described, it will be obvious to those skilled in the art that various modifications may be made without departing from what is intended to be limited solely by the appended claims.

What is claimed is:

1. A method for fabricating semiconductor devices comprising:
   providing a semiconductor device;
   forming a gate oxide layer and a polysilicon layer over said semiconductor substrate one after another;
   coating a dielectric layer over said polysilicon layer;
   forming an anti-reflection layer over said dielectric layer;
   forming a photoresist layer over said anti-reflection layer for defining the location of a gate electrode;
   using said photoresist layer as a mask for etching said anti-reflection layer and carrying out a photoresist shrink process, where a substantial portion of said dielectric layer is also etched;
   using said photoresist layer as a mask for etching said dielectric layer, in accompanying with that, said photoresist layer and said anti-reflection layer are also etched partially;
   using said photoresist layer as a mask for etching said polysilicon layer till a surface of said gate oxide layer is exposed, in accompanying with that, said photoresist layer and said anti-reflection layer are removed; and
   removing said dielectric layer that is on top of said polysilicon layer.

2. The method in accordance with claim 1, wherein said dielectric layer comprises an organic material with low dielectric constant.

3. The method in accordance with claim 1, wherein said anti-reflection layer comprises an inorganic material.

4. The method in accordance with claim 3, wherein said inorganic material comprises silicon oxynitride.

5. The method in accordance with claim 1, wherein said photoresist shrink process comprises fluorocarbon/oxygen/helium ($C_2F_6/O_2$/He) gas mixture.

6. A method for fabricating semiconductor devices comprising:
   providing silicon substrate;
   forming a gate oxide layer and a polysilicon layer over said silicon substrate one after another;
   coating an organic material layer having low dielectric constant over said polysilicon layer;
   forming an anti-reflection layer over said organic material layer;
   forming a photoresist layer over said anti-reflection layer for defining the location of a gate electrode;
   using said photoresist layer as a mask for etching said anti-reflection layer and carrying out a photoresist shrink process, where a substantial portion of said organic material layer is also etched;
   using said photoresist layer as a mask for etching said organic material layer, in accompanying with that, said photoresist layer and said anti-reflection layer are also etched partially;
   using said photoresist layer as a mask for etching said polysilicon layer till a surface of said gate oxide layer is exposed, in accompanying with that, said photoresist layer and said anti-reflection layer are removed; and
   removing said organic material layer that is on top of said polysilicon layer.

7. The method in accordance with claim 6, wherein said gate oxide layer is formed by using dry oxidation.

8. The method in accordance with claim 6, wherein said gate electrode comprises polysilicon.

9. The method in accordance with claim 6, wherein said gate electrode comprises phosphorus.

10. The method in accordance with claim 6, wherein said gate electrode comprises arsenic.

11. The method in accordance with claim 6, wherein etching said organic material layer is accomplished by using dry etching.

12. The method in accordance with claim 6, wherein etching said polysilicon layer is accomplished by using anisotropic etching.

13. The method in accordance with claim 6, wherein said anti-reflection layer comprises an inorganic material.

14. The method in accordance with claim 13, wherein said inorganic material comprises silicon oxynitride.

15. The method in accordance with claim 6, wherein said photoresist shrink process comprises fluorocarbon/oxygen/helium ($C_2F_6/O_2$/He) gas mixture.

* * * * *